(12) United States Patent
Kondo et al.

(10) Patent No.: US 7,348,057 B2
(45) Date of Patent: *Mar. 25, 2008

(54) ACRYLIC ADHESIVE SHEET

(75) Inventors: Kazunori Kondo, Ibaraki-ken (JP);
Shigehiro Hoshida, Ibaraki-ken (JP);
Michio Aizawa, Ibaraki-ken (JP);
Tadashi Amano, Ibaraki-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 470 days.

This patent is subject to a terminal disclaimer.

(21) Appl. No.: 10/983,736

(22) Filed: Nov. 9, 2004

(65) Prior Publication Data

US 2005/0101734 A1    May 12, 2005

(30) Foreign Application Priority Data

Nov. 10, 2003  (JP) ............................ 2003-379817

(51) Int. Cl.
| | | |
|---|---|---|
| B32B 27/30 | (2006.01) | |
| B32B 27/32 | (2006.01) | |
| B32B 27/36 | (2006.01) | |
| B32B 27/38 | (2006.01) | |
| C08L 33/02 | (2006.01) | |

(52) U.S. Cl. ................... 428/352; 428/355 EP; 428/355 AK; 428/355 AC; 525/109

(58) Field of Classification Search ............. None
See application file for complete search history.

(56) References Cited

U.S. PATENT DOCUMENTS

| | | | |
|---|---|---|---|
| 2003/0069331 A1* | 4/2003 | Teiichi et al. .......... | 523/176 |
| 2005/0196619 A1* | 9/2005 | Nakanishi et al. ...... | 428/416 |
| 2006/0069200 A1* | 3/2006 | Kondo et al. .......... | 524/502 |
| 2006/0069201 A1* | 3/2006 | Kondo et al. .......... | 524/502 |
| 2006/0234043 A1* | 10/2006 | Nakanishi et al. ...... | 428/344 |
| 2006/0234044 A1* | 10/2006 | Nakanishi et al. ...... | 428/344 |
| 2006/0234045 A1* | 10/2006 | Nakanishi et al. ...... | 428/344 |
| 2006/0264538 A1* | 11/2006 | Nakanishi et al. ...... | 523/451 |

FOREIGN PATENT DOCUMENTS

| | | | |
|---|---|---|---|
| DE | 2853646 A | * | 6/1980 |
| GB | 2055109 A | * | 2/1981 |
| JP | 61-261307 A | | 11/1986 |
| JP | 05-51569 A | * | 3/1993 |
| JP | 7-11092 A | * | 1/1995 |
| JP | 7-93497 A | | 10/1995 |
| JP | 2003-286391 A | * | 10/2003 |

* cited by examiner

Primary Examiner—Robert Sellers
(74) Attorney, Agent, or Firm—Birch, Stewart, Kolasch & Birch, LLP

(57) ABSTRACT

An adhesive sheet made of an acrylic adhesive composition comprising (A) an acrylic polymer containing carboxyl groups and having a Tg of 5-30° C., (B) a resol phenolic resin, (C) an epoxy resin, and (D) a curing accelerator has improved heat resistance, processing and handling as well as good adhesion, and is suited for use in the manufacture of FPC.

10 Claims, No Drawings

ACRYLIC ADHESIVE SHEET

CROSS-REFERENCE TO RELATED APPLICATION

This non-provisional application claims priority under 35 U.S.C. §119(a) on patent application Ser. No. 2003-379817 filed in Japan on Nov. 10, 2003, the entire contents of which are hereby incorporated by reference.

TECHNICAL FIELD

This invention relates to an acrylic adhesive sheet which has improved heat resistance, processing and handling as well as good adhesion, and is suited for use with flexible printed circuit boards.

BACKGROUND ART

The electronic industry continues challenges to a smaller size, lighter weight and higher circuit density in electronic equipment. This has created an increasing demand for flexible multilayer printed circuit boards in which four or more layers of flexible printed circuit laminate (FPC) are stacked. In the manufacture of the multilayer FPC, two or more single or double-sided copper clad laminates are joined into a multilayer structure using adhesive sheets. The adhesive sheets used for multilayer construction are desired to be improved in performance factors such as adhesion, heat resistance, processing and handling. It was very difficult to have an adhesive sheet that satisfies all the required properties at the same time.

For example, adhesive sheets which have been widely used in the FPC application include NBR and acrylic based adhesive sheets, which have problems as described below. The NBR based adhesive sheets can be easily processed, but are likely to lose bond strength due to thermal degradation. The acrylic based adhesive sheets maintain good adhesion, but are less processable because a long period of hot pressing is necessary. Another drawback is low heat resistance after moisture absorption.

The related references include JP-B 7-93497 and JP-A 61-261307.

SUMMARY OF THE INVENTION

An object of the invention is to provide a novel acrylic adhesive sheet which has solved the above-discussed problems and is improved in adhesion, heat resistance, processing and handling.

The inventors have discovered that an adhesive sheet comprising primarily a carboxyl-bearing acrylic polymer having a specific glass transition temperature is improved in adhesion, heat resistance, processing and handling.

The present invention provides an acrylic adhesive sheet made of an acrylic adhesive composition comprising (A) 100 parts by weight of an acrylic polymer containing carboxyl groups and having a glass transition temperature of 5 to 30° C., (B) 1 to 20 parts by weight of a resol phenolic resin, (C) 1 to 20 parts by weight of an epoxy resin, and (D) 0.1 to 3 parts by weight of a curing accelerator.

The adhesive sheet of the invention is improved in adhesion, heat resistance, processing and handling and best suited for use with FPC, especially multilayer FPC.

DESCRIPTION OF THE PREFERRED EMBODIMENTS

Component (A) which is used in the acrylic adhesive composition of the invention is an acrylic polymer containing carboxyl groups and having a glass transition temperature of 5 to 30° C. The acrylic polymer is generally constructed of a major proportion of an acrylic acid ester and a minor proportion of a carboxyl-containing monomer. It may be prepared from such monomers by any of conventional polymerization methods such as solution polymerization, emulsion polymerization, suspension polymerization and bulk polymerization.

The preferred acrylic polymer (A) is a copolymer obtained through copolymerization of three components: (a) an acrylic acid ester and/or methacrylic acid ester, (b) acrylonitrile and/or methacrylonitrile, and (c) an unsaturated carboxylic acid.

The acrylic acid ester and methacrylic acid ester (a) are to confer flexibility on the acrylic adhesive composition. Examples of suitable acrylic acid esters include methyl acrylate, ethyl acrylate, n-butyl acrylate, isobutyl acrylate, isopentyl acrylate, n-hexyl acrylate, isooctyl acrylate, 2-ethylhexyl acrylate, n-octyl acrylate, isononyl acrylate, n-decyl acrylate, isodecyl acrylate, etc. Examples of suitable methacrylic acid esters include methyl methacrylate, ethyl methacrylate, n-butyl methacrylate, isobutyl methacrylate, isopentyl methacrylate, n-hexyl methacrylate, isooctyl methacrylate, 2-ethylhexyl methacrylate, n-octyl methacrylate, isononyl methacrylate, n-decyl methacrylate, and isodecyl methacrylate. Preferred are those (meth)acrylic acid esters in which the alkyl moiety has 1 to 12 carbon atoms, especially 1 to 4 carbon atoms. These esters may be used alone or in admixture of any.

Preferably component (a) is used in such amounts that the proportion of units derived from component (a) is 50 to 80% by weight, more preferably 55 to 75% by weight of the acrylic polymer (A). Less than 50% by weight of component (a) may compromise flexibility whereas more than 80% by weight of component (a) may allow for squeeze-out during press working.

Acrylonitrile and methacrylonitrile (b) are to confer heat resistance, adhesion and chemical resistance. Either acrylonitrile or methacrylonitrile or both may be used. Preferably component (b) is used in such amounts that the proportion of units derived from component (b) is 15 to 45% by weight, more preferably 20 to 40% by weight of the acrylic polymer (A). Less than 15% by weight of component (b) may lead to poor heat resistance whereas more than 45% by weight of component (b) may compromise flexibility.

The unsaturated carboxylic acid (c) is to confer adhesion and serves as crosslinking sites when heated. Copolymerizable vinyl monomers having a carboxyl group are useful. Examples include acrylic acid, methacrylic acid, crotonic acid, maleic acid, fumaric acid and itaconic acid. Preferably component (c) is used in such amounts that the proportion of units derived from component (c) is 2 to 10% by weight, more preferably 4 to 8% by weight of the acrylic polymer (A). Less than 2% by weight of component (c) may be too small to achieve the crosslinking effect. More than 10% by weight of component (c) may lead to an excessive degree of crosslinking, detracting from close contact with an adherent which causes bubbles and blisters to be generated during heat curing treatment or solder bath treatment.

In the practice of the invention, the acrylic polymer must have a glass transition temperature (Tg) in the range of 5 to 30° C., preferably 10 to 25° C. The use of an acrylic polymer having a Tg in that range enables to form a sheet which has a satisfactory film strength and allows for re-bonding after preliminary bonding so that an adhesive sheet which is easy to handle is obtainable. With a Tg of lower than 5° C., the resulting adhesive sheet is difficult to handle because of a substantial tack and little film strength. With a Tg of higher than 30° C., the resulting adhesive sheet is tack-free and has film strength, but is less adhesive. It is noted that the glass transition temperature (Tg) is measured by means of a differential scanning calorimeter (DSC). Preferably, the acrylic polymer has a weight average molecular weight of 100,000 to 1,000,000, more preferably 300,000 to 600,000, as determined by gel permeation chromatography (GPC) using polystyrene standards.

Component (B) is a resol phenolic resin, which is to confer such properties as heat curing ability, heat resistance and adhesion on the acrylic adhesive sheet. Included are resol phenolic resins prepared using phenol, bisphenol A, alkylphenols such as p-t-butylphenol, octylphenol, and p-cumylphenol, p-phenylphenol, cresol or the like as the raw material.

The resol phenolic resin (B) is compounded in an amount of 1 to 20 parts by weight, preferably 1 to 13 parts by weight per 100 parts by weight of the acrylic polymer (A). Less than 1 part by weight of the phenolic resin leads to a short heat-curing ability whereas more than 20 parts by weight detracts from bond strength.

Component (C) is an epoxy resin, which is to confer heat curing ability and bond strength on the acrylic adhesive sheet. Preferred epoxy resins contain at least two epoxy groups and have an epoxy equivalent of 100 to 1,000. Suitable epoxy resins include bisphenol A epoxy resins, novolac epoxy resins, glycidyl amine type epoxy resins and aliphatic epoxy resins. The use of epoxy resins having an epoxy equivalent of 100 to 1,000, preferably 100 to 500 ensures a satisfactory bond strength. The use of epoxy resins having an epoxy equivalent of less than 100 may lead to a decline of bond strength whereas epoxy resins having an epoxy equivalent in excess of 1,000 afford lower reactivity and hence less heat curing ability. Also useful are epoxy-modified phenolic resins which are combinations of a phenolic resin with an epoxy resin both satisfying the above-mentioned requirements.

The epoxy resin (C) is compounded in an amount of 1 to 20 parts by weight, preferably 2 to 10 parts by weight per 100 parts by weight of the acrylic polymer (A). Less than 1 part by weight of the epoxy resin leads to a short heat-curing ability. More than 20 parts by weight causes excessive crosslinking, detracting from close contact with an adherent which causes bubbles and blisters to be generated during heat curing treatment or solder bath treatment.

Component (D) is a curing accelerator, which is typically selected from tertiary amines, aromatic amines, and imidazoles. Suitable tertiary amines include triethylamine, benzyldimethylamine, and α-methylbenzyldimethylamine. Suitable aromatic amines include m-phenylenediamine, xylylenediamine, m-xylylenediamine, 2,4-toluylenediamine, m-toluylenediamine, o-toluylenediamine, 4,4'-diaminodiphenylmethane, 4,4'-diaminodiphenyl ether and 4,4'-diaminodiphenylsulfone. Suitable imidazoles include 2-methylimidazole, 2-ethyl-4-methylimidazole, 2-phenylimidazole, 2-phenyl-4-methylimidazole, 1-benzyl-2-methylimidazole, 1-(2-cyanoethyl)-2-methylimidazole, and 1-(2-cyanoethyl)-2-ethyl-4-methylimidazole. Of these, the imidazoles are preferred, with 2-ethyl-4-methylimidazole, 2-phenyl-4-methylimidazole, and 1-(2-cyanoethyl)-2-ethyl-4-methylimidazole being especially preferred. The accelerator is not limited to the above.

The accelerator (D) is compounded in an amount of 0.1 to 3 parts by weight, preferably 0.5 to 2 parts by weight per 100 parts by weight of the acrylic polymer (A). Less than 0.1 part by weight of the accelerator fails to achieve the desired effect, resulting in a loss of heat resistance. More than 3 parts by weight of the accelerator achieves little further improvement in the cure accelerating effect and instead, adversely affects bond strength and heat resistance.

In addition to the foregoing components, if necessary, an inorganic filler may be added to the acrylic adhesive composition of the invention for improving soldering heat resistance. Any inorganic fillers are useful as long as they have a higher modulus of elasticity than resins and are electrically insulating. Suitable inorganic fillers include fillers in powder form such as aluminum hydroxide, magnesium hydroxide, talc, alumina, magnesia, silica, titanium dioxide, calcium silicate, aluminum silicate, calcium carbonate, clay, silicon nitride, silicon carbide, aluminum borate, and synthetic mica; fillers in short fiber form such as glass, asbestos, rock wool, and aramid fibers; and fillers in whisker form such as silicon carbide, alumina and aluminum borate whiskers.

It is preferable to compound the inorganic filler in an amount of 10 to 40 parts by weight, more preferably 15 to 35 parts by weight per 100 parts by weight of the acrylic polymer (A). Less than 10 parts by weight of the filler may fail to achieve the desired effect. More than 40 parts by weight of the filler may achieve little further improvement in the desired effect and instead, adversely affect bond strength and heat resistance.

Also, a flame retardant may be added to the adhesive composition for conferring flame retardance as long as it does not compromise the adhesion, heat resistance and other desired properties. Environmental considerations recommend to avoid the use of antimony trioxide and halogenated compounds such as brominated epoxy resins. The use of phosphorus and nitrogen based flame retardants is preferred.

The acrylic adhesive composition may be prepared by combining the above-mentioned components and optional well-known components and mixing them in a conventional manner. The resulting acrylic adhesive composition is applied to a release substrate and dried in a conventional manner, and if necessary, another release substrate is attached, completing the acrylic adhesive sheet of the invention.

The release substrates to which the inventive composition is applicable include plastic films such as polyethylene (PE) film, polypropylene (PP) film, polymethylpentene (TPX) film, and release agent-coated polyethylene terephthalate (PET) film, and release paper sheets in which a paper base is coated on one side or both sides with such films.

The acrylic adhesive sheet of the invention has a thickness which is preferably in the range of 10 to 100 μm, more preferably 15 to 75 μm, though not critical. The drying of the composition to form a sheet is desirably conducted by heating at about 60 to about 140° C. for a short time, with the heating temperature depending on the type of solvent used.

EXAMPLE

Examples are given below for further illustrating the invention, but the invention is not limited thereto. In all Examples, the weight average molecular weight (Mw) was measured by a gel permeation chromatography (GPC) system HLC-8020 (Tosoh Corp.) using two columns TSK-GEL

Example 1

There was furnished 100 parts by weight, calculated as solids, of a 15 wt % methyl ethyl ketone solution of an acrylic polymer derived from butyl acrylate, acrylonitrile and methacrylic acid in a weight ratio of 67/29/4 and having a Mw of 450,000 and a Tg of 7° C. To the polymer were added 2.0 parts by weight of a resol phenolic resin (Phenolite J-325, OH equivalent 65, by Dainippon Ink & Chemicals, Inc.), 4.0 parts by weight of an epoxy resin (Epikote 1001, bisphenol A type, epoxy equivalent 450-500, by Japan Epoxy Resin Co., Ltd.), and 1.0 part by weight of a curing accelerator 2-ethyl-4-methylimidazole (Curezol 2E4MZ, by Shikoku Chemicals Corp.). The ingredients were mixed in a conventional manner, yielding an acrylic adhesive composition, Inventive Adhesive 1.

Example 2

To 100 parts by weight of an acrylic polymer derived from butyl acrylate, ethyl acrylate, acrylonitrile and methacrylic acid in a weight ratio of 36/29/28/7 and having a Mw of 470,000 and a Tg of 14° C. were added 5.0 parts by weight of a resol phenolic resin (Phenolite J-325), 7.0 parts by weight of an epoxy resin (Epikote 1001), and 1.0 part by weight of a curing accelerator 2-ethyl-4-methylimidazole (Curezol 2E4MZ). The ingredients were mixed in a conventional manner, yielding an acrylic adhesive composition, Inventive Adhesive 2.

Example 3

An acrylic adhesive composition, Inventive Adhesive 3, was prepared as in Example 2 except that 12 parts by weight of a resol phenolic resin (Phenolite 5592, epoxy modified, OH equivalent 72, by Dainippon Ink & Chemicals, Inc.) was used instead of 5.0 parts by weight of the resol phenolic resin (Phenolite J-325) and the amount of the epoxy resin (Epikote 1001) was changed from 7.0 parts to 18 parts by weight.

Example 4

An acrylic adhesive composition, Inventive Adhesive 4, was prepared as in Example 2 except that the amount of the curing accelerator 2-ethyl-4-methylimidazole (Curezol 2E4MZ) was changed from 1.0 part to 0.5 part by weight.

Example 5

To 100 parts by weight of an acrylic polymer derived from butyl acrylate, ethyl acrylate, acrylonitrile and methacrylic acid in a weight ratio of 31/29/35/5 and having a Mw of 600,000 and a Tg of 21° C. were added 3.0 parts by weight of a resol phenolic resin (Phenolite J-325), 5.0 parts by weight of an epoxy resin (Epikote 1001), and 1.0 part by weight of a curing accelerator 2-ethyl-4-methylimidazole (Curezol 2E4MZ). The ingredients were mixed in a conventional manner, yielding an acrylic adhesive composition, Inventive Adhesive 5.

Example 6

To 100 parts by weight of an acrylic polymer derived from butyl acrylate, methyl methacrylate, methacrylonitrile and acrylic acid in a weight ratio of 48/20/24/8 and having a Mw of 530,000 and a Tg of 28° C. were added 7.0 parts by weight of a resol phenolic resin (Phenolite J-325), 6.0 parts by weight of an epoxy resin (Epikote 1001), and 1.0 part by weight of a curing accelerator 2-ethyl-4-methylimidazole (Curezol 2E4MZ). The ingredients were mixed in a conventional manner, yielding an acrylic adhesive composition, Inventive Adhesive 6.

Example 7

An acrylic adhesive composition, Inventive Adhesive 7, was prepared as in Example 2 except that 5.0 parts by weight of a resol phenolic resin (Phenolite 5592, by Dainippon Ink & Chemicals, Inc.) was used instead of 5.0 parts by weight of the resol phenolic resin (Phenolite J-325) and the amount of the epoxy resin (Epikote 1001) was changed from 7.0 parts to 5.0 parts by weight.

Example 8

An acrylic adhesive composition, Inventive Adhesive 8, was prepared as in Example 2 except that 15 parts by weight of a resol phenolic resin (Shownol BLS-722, butyral modified, OH equivalent 1,000, by Showa Highpolymer Co., Ltd.) was used instead of 5.0 parts by weight of the resol phenolic resin (Phenolite J-325) and the amount of the epoxy resin (Epikote 1001) was changed from 7.0 parts to 12 parts by weight.

Example 9

An acrylic adhesive composition, Inventive Adhesive 9, was prepared as in Example 2 except that 12 parts by weight of an epoxy resin (Epikote 1003, bisphenol A type, epoxy equivalent 670-770, by Japan Epoxy Resin Co., Ltd.) was used instead of 7 parts by weight of the epoxy resin (Epikote 1001) and 1.0 part by weight of a curing accelerator 1-(2-cyanoethyl)-2-ethyl-4-methylimidazole (Curezol 2E4MZ-CN, by Shikoku Chemicals Corp.) was used instead of 1.0 part by weight of the curing accelerator 2-ethyl-4-methylimidazole (Curezol 2E4MZ).

Example 10

An acrylic adhesive composition, Inventive Adhesive 10, was prepared as in Example 5 except that the amount of the resol phenolic resin (Phenolite J-325) was changed from 3.0 parts to 5.0 parts by weight, 5.0 parts by weight of an epoxy resin (Epikote 154, phenol novolac type, epoxy equivalent 176-180, by Japan Epoxy Resin Co., Ltd.) was used instead of 5.0 parts by weight of the epoxy resin (Epikote 1001), and 1.0 part by weight of a curing accelerator 1-(2-cyanoethyl)-2-ethyl-4-methylimidazole (Curezol 2E4MZ-CN) was used instead of 1.0 part by weight of the curing accelerator 2-ethyl-4-methylimidazole (Curezol 2E4MZ).

Example 11

An acrylic adhesive composition, Inventive Adhesive 11, was prepared as in Example 10 except that 5.0 parts by weight of an epoxy resin (Epikote 604, glycidyl amine type, epoxy equivalent 110-130, by Japan Epoxy Resin Co., Ltd.) was used instead of 5.0 parts by weight of the epoxy resin (Epikote 154).

Example 12

An acrylic adhesive composition, Inventive Adhesive 12, was prepared as in Example 2 except that 5 parts by weight of aluminum hydroxide (Hidilite H-43STE, by Showa Denko K. K.) as an inorganic filler was added to 100 parts by weight of the acrylic polymer.

Example 13

An acrylic adhesive composition, Inventive Adhesive 13, was prepared as in Example 2 except that 15 parts by weight of aluminum hydroxide (Hidilite H-43STE) as an inorganic filler was added to 100 parts by weight of the acrylic polymer.

Example 14

An acrylic adhesive composition, Inventive Adhesive 14, was prepared as in Example 2 except that 35 parts by weight of aluminum hydroxide (Hidilite H-43STE) as an inorganic filler was added to 100 parts by weight of the acrylic polymer.

Example 15

An acrylic adhesive composition, Inventive Adhesive 15, was prepared as in Example 2 except that 45 parts by weight of aluminum hydroxide (Hidilite H-43STE) as an inorganic filler was added to 100 parts by weight of the acrylic polymer.

Comparative Example 1

An acrylic adhesive composition, Comparative Adhesive 1, was prepared as in Example 5 except that the acrylic polymer was changed to an acrylic polymer derived from butyl acrylate, acrylonitrile and methacrylic acid in a weight ratio of 80/15/5 and having a Mw of 420,000 and a Tg of −13° C.

Comparative Example 2

An acrylic adhesive composition, Comparative Adhesive 2, was prepared as in Example 5 except that the acrylic polymer was changed to an acrylic polymer derived from butyl acrylate, acrylonitrile and methacrylic acid in a weight ratio of 72/23/5 and having a Mw of 550,000 and a Tg of −3° C.

Comparative Example 3

An acrylic adhesive composition, Comparative Adhesive 3, was prepared as in Example 5 except that the acrylic polymer was changed to an acrylic polymer derived from butyl acrylate, methyl methacrylate, acrylonitrile and methacrylic acid in a weight ratio of 45/25/25/5 and having a Mw of 350,000 and a Tg of 33° C.

Comparative Example 4

An acrylic adhesive composition, Comparative Adhesive 4, was prepared as in Example 4 except that 5.0 parts by weight of a novolac phenolic resin (Phenolite TD-2093, by Dainippon Ink & Chemicals, Inc.) was used instead of 5.0 parts by weight of the resol phenolic resin (Phenolite J-325).

Comparative Example 5

An acrylic adhesive composition, Comparative Adhesive 5, was prepared as in Example 5 except that 3.0 parts by weight of a novolac phenolic resin (Phenolite LF-7911, by Dainippon Ink & Chemicals, Inc.) was used instead of 3.0 parts by weight of the resol phenolic resin (Phenolite J-325).

Comparative Example 6

An acrylic adhesive composition, Comparative Adhesive 6, was prepared as in Example 5 except that the amount of the resol phenolic resin (Phenolite J-325) was changed from 3.0 parts to 25 parts by weight.

Comparative Example 7

An acrylic adhesive composition, Comparative Adhesive 7, was prepared as in Example 5 except that the amount of the epoxy resin (Epikote 1001) was changed from 5.0 parts to 25 parts by weight.

Comparative Example 8

An acrylic adhesive composition, Comparative Adhesive 8, was prepared as in Example 2 except that the amount of the curing accelerator 2-ethyl-4-methylimidazole (Curezol 2E4MZ) was changed from 1.0 part to 4.0 parts by weight.

Comparative Example 9

An acrylic adhesive composition, Comparative Adhesive 9, was prepared as in Example 4 except that the resol phenolic resin (Phenolite J-325) was omitted.

Comparative Example 10

An acrylic adhesive composition, Comparative Adhesive 10, was prepared as in Example 4 except that the epoxy resin (Epikote 1001) was omitted.

Comparative Example 11

An acrylic adhesive composition, Comparative Adhesive 11, was prepared as in Example 4 except that the curing accelerator (Curezol 2E4MZ) was omitted.

TEST

Each of the acrylic adhesive compositions prepared in Examples and Comparative Examples was applied onto a release substrate and dried at 120° C. for 10 minutes to form an adhesive film of 25 μm thick. Another release substrate was joined to the film to complete an adhesive sheet.

To measure the physical properties of this adhesive sheet, a test specimen was constructed by peeling the release substrates, and sandwiching the adhesive sheet between polyimide films (Kapton 50H, by DuPont) of 43.5-μm thick single-side FPC substrates, followed by pressing at a temperature of 170° C. and a pressure of 4 MPa for 40 minutes.

Another test specimen was similarly constructed by sandwiching the adhesive sheet between a bright surface of a 35-μm thick electrolytic copper foil and a 25-μm thick polyimide film (Kapton 100H), followed by pressing at a temperature of 170° C. and a pressure of 4 MPa for 40 minutes.

The thus constructed specimens were observed for outer appearance after curing and examined for properties. The results are shown in Tables 1 and 2. The following methods were used in measuring the physical properties of FPC laminate film reported in Tables 1 and 2.

(1) Peel Strength

Measured according to JIS C6481. A strip of 10 mm wide was peeled from the copper foil or single-side FPC substrate by pulling in a direction of 90° C. and at a rate of 50 mm/min.

(2) Soldering Heat Resistance

A sample of 25 mm square was cut from the specimen of electrolytic copper foil bonded to polyimide film. The sample was kept afloat in a solder bath at different temperatures for 30 seconds, and the temperature at which neither blister nor discoloration occurred was determined. Soldering heat resistance after moisture absorption was determined by holding the sample under conditions of 40° C. and 90% RH for 1 hour for allowing the sample to take up moisture, then keeping the sample afloat in a solder bath at different temperatures for 30 seconds, and determining the temperature at which neither blister nor discoloration occurred.

(3) Handling of Adhesive Sheet (3-1) Peeling of Adhesive Sheet from Release Substrate It was examined whether or not the adhesive sheet was smoothly peeled from the release substrate. The rating was "Pass" when the adhesive sheet could be peeled without deformation and "Reject" when deformation or stretching occurred.

(3-2) Replacement of Adhesive Sheet

The adhesive sheet was attached to the polyimide film surface of the single-side FPC for some time. Thereafter, it was examined whether or not the adhesive sheet could be replaced by another. The rating was "Pass" when replacement was possible, and "Reject" when replacement was impossible due to the substantial tack of the adhesive sheet.

TABLE 1

Monomer composition of acrylic polymer, and composition and physical properties of adhesive sheet

| | | Example | | | | | | | | | | | | | | |
|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 |
| Monomer composition (wt %) of acrylic polymer | Butyl acrylate | 67 | 36 | 36 | 36 | 31 | 48 | 36 | 36 | 36 | 31 | 31 | 36 | 36 | 36 | 36 |
| | Ethyl acrylate | | 29 | 29 | 29 | 29 | | 29 | 29 | 29 | 29 | 29 | 29 | 29 | 29 | 29 |
| | Methyl methacrylate | | | | | | 20 | | | | | | | | | |
| | Acrylonitrile | 29 | 28 | 28 | 28 | 35 | | 28 | 28 | 28 | 35 | 35 | 28 | 28 | 28 | 28 |
| | Methacrylonitrile | | | | | | 24 | | | | | | | | | |
| | Acrylic acid | | | | | | 8 | | | | | | | | | |
| | Methacrylic acid | 4 | 7 | 7 | 7 | 5 | | 7 | 7 | 7 | 5 | 5 | 7 | 7 | 7 | 7 |
| Tg (° C.) of acrylic polymer | | 7 | 14 | 14 | 14 | 21 | 28 | 14 | 14 | 14 | 21 | 21 | 14 | 14 | 14 | 14 |
| Amount (pbw) of acrylic polymer compounded | | 100 | 100 | 100 | 100 | 100 | 100 | 100 | 100 | 100 | 100 | 100 | 100 | 100 | 100 | 100 |
| Amount (pbw) of resol phenolic resin compounded | Phenolite J-325 | 2.0 | 5.0 | | 5.0 | 3.0 | 7.0 | | | 5.0 | 5.0 | 5.0 | 5.0 | 5.0 | 5.0 | 5.0 |
| | Phenolite 5592 | | | 12 | | | | 5.0 | | | | | | | | |
| | Shownol BLS-722 | | | | | | | | 15 | | | | | | | |
| Amount (pbw) of novolac phenolic resin compounded | Phenolite TD-2093 | | | | | | | | | | | | | | | |
| | Phenolite LF-7911 | | | | | | | | | | | | | | | |
| Amount (pbw) of epoxy resin compounded | Epikote 1001 | 4.0 | 7.0 | 18 | 7.0 | 5.0 | 6.0 | 5.0 | 12 | | | | 7.0 | 7.0 | 7.0 | 7.0 |
| | Epikote 1003 | | | | | | | | | 12 | | | | | | |
| | Epikote 154 | | | | | | | | | | 5.0 | | | | | |
| | Epikote 604 | | | | | | | | | | | 5.0 | | | | |
| Amount (pbw) of accelerator compounded | Curezol 2E4MZ | 1.0 | 1.0 | 1.0 | 0.5 | 1.0 | 1.0 | 1.0 | 1.0 | | | | 1.0 | 1.0 | 1.0 | 1.0 |
| | Curezol 2E4MZ-CN | | | | | | | | | 1.0 | 1.0 | 1.0 | | | | |
| Amount (pbw) of inorganic filler compounded | Aluminum hydroxide | | | | | | | | | | | | 5 | 15 | 35 | 45 |
| Peel strength (N/mm) | Polyimide-Cu foil | 1.4 | 1.5 | 1.4 | 1.6 | 1.5 | 1.5 | 1.6 | 1.6 | 1.4 | 1.6 | 1.5 | 1.5 | 1.4 | 1.4 | 1.2 |
| | Polyimide-polyimide | 1.5 | 1.6 | 1.5 | 1.8 | 1.6 | 1.5 | 1.7 | 1.5 | 1.3 | 1.7 | 1.4 | 1.6 | 1.5 | 1.5 | 1.3 |
| Soldering heat resistance (° C.) | Normal | 300 | 310 | 310 | 300 | 300 | 310 | 300 | 310 | 310 | 300 | 300 | 310 | 320 | 320 | 300 |
| | After moisture absorption | 260 | 270 | 270 | 260 | 270 | 280 | 260 | 270 | 260 | 260 | 260 | 270 | 280 | 280 | 260 |

TABLE 1-continued

Monomer composition of acrylic polymer, and composition and physical properties of adhesive sheet

| | Example | | | | | | | | | | | | | | |
|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 |
| Peeling of adhesive sheet from release substrate | Pass | Pass | Pass | Pass | Pass | Pass | Pass | Pass | Pass | Pass | Pass | Pass | Pass | Pass | Pass |
| Replacement of adhesive sheet | Pass | Pass | Pass | Pass | Pass | Pass | Pass | Pass | Pass | Pass | Pass | Pass | Pass | Pass | Pass |

TABLE 2

| | | Comparative Example | | | | | | | | | | |
|---|---|---|---|---|---|---|---|---|---|---|---|---|
| | | 1 | 2 | 3 | 4 | 5 | 6 | 7 | 8 | 9 | 10 | 11 |
| Monomer composition (wt %) of acrylic polymer | Butyl acrylate | 80 | 72 | 45 | 36 | 31 | 31 | 31 | 36 | 36 | 36 | 36 |
| | Ethyl acrylate | | | | 29 | 29 | 29 | 29 | 29 | 29 | 29 | 29 |
| | Methyl methacrylate | | | 25 | | | | | | | | |
| | Acrylonitrile | 15 | 23 | 25 | 28 | 35 | 35 | 35 | 28 | 28 | 28 | 28 |
| | Methacrylonitrile | | | | | | | | | | | |
| | Acrylic acid | | | | | | | | | | | |
| | Methacrylic acid | 5 | 5 | 5 | 7 | 5 | 5 | 5 | 7 | 7 | 7 | 7 |
| Tg (° C.) of acrylic polymer | | −13 | −3 | 33 | 14 | 21 | 21 | 21 | 14 | 14 | 14 | 14 |
| Amount (pbw) of acrylic polymer compounded | | 100 | 100 | 100 | 100 | 100 | 100 | 100 | 100 | 100 | 100 | 100 |
| Amount (pbw) of resol phenolic resin compounded | Phenolite J-325 | 3.0 | 3.0 | 3.0 | | | 25 | 3.0 | 5.0 | | 5.0 | 5.0 |
| | Phenolite 5592 | | | | | | | | | | | |
| | Shownol BLS-722 | | | | | | | | | | | |
| Amount (pbw) of novolac phenolic resin compounded | Phenolite TD-2093 | | | | 5.0 | | | | | | | |
| | Phenolite LF-7911 | | | | | 3.0 | | | | | | |
| Amount (pbw) of epoxy resin compounded | Epikote 1001 | 5.0 | 5.0 | 5.0 | 7.0 | 5.0 | 5.0 | 25 | 7.0 | 7.0 | | 7.0 |
| | Epikote 1003 | | | | | | | | | | | |
| | Epikote 154 | | | | | | | | | | | |
| | Epikote 604 | | | | | | | | | | | |
| Amount (pbw) of accelerator compounded | Curezol 2E4MZ | 1.0 | 1.0 | 1.0 | 0.5 | 1.0 | 1.0 | 1.0 | 4.0 | 0.5 | 0.5 | |
| | Curezol 2E4MZ-CN | | | | | | | | | | | |
| Amount (pbw) of inorganic filler compounded | Aluminum hydroxide | | | | | | | | | | | |
| Peel strength (N/mm) | Polyimide-Cu foil | 1.9 | 1.7 | 1.0 | 0.3 | 0.3 | 0.8 | 0.4 | 1.1 | 1.2 | 0.8 | 1.6 |
| | Polyimide-polyimide | 2.1 | 1.6 | 0.9 | 0.3 | 0.3 | 0.7 | 0.3 | 0.9 | 0.8 | 0.6 | 1.7 |
| Soldering heat resistance (° C.) | Normal | ≦260 | 290 | 300 | ≦260 | ≦260 | 280 | ≦260 | ≦260 | 290 | ≦260 | 280 |
| | After moisture absorption | ≦240 | 250 | 250 | ≦240 | ≦240 | 250 | ≦240 | ≦240 | 250 | ≦240 | 240 |
| Peeling of adhesive sheet from release substrate | | Reject | Reject | Pass | Pass | Pass | Reject | Pass | Pass | Pass | Reject | Pass |
| Replacement of adhesive sheet | | Reject | Reject | Pass | Pass | Pass | Reject | Pass | Pass | Pass | Reject | Pass |

As seen from the results, the acrylic adhesive sheets of the invention are easy to handle and used to fabricate FPC substrates through brief pressing, the resulting FPC substrates having the advantages of adhesion and soldering heat resistance. The invention is thus of great worth in the industrial application.

Japanese Patent Application No. 2003-379817 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. An acrylic adhesive sheet made of an acrylic adhesive composition comprising
   (A) 100 parts by weight of an acrylic polymer containing carboxyl groups and having a glass transition temperature of 5 to 30° C.,
   (B) 1 to 20 parts by weight of a resol phenolic resin,
   (C) 1 to 20 parts by weight of an epoxy resin, and
   (D) 0.1 to 3 parts by weight of a curing accelerator.

2. The acrylic adhesive sheet of claim 1, wherein the acrylic polymer (A) is a copolymer obtained through copolymerization of (a) 50 to 80% by weight of an acrylic acid ester and/or methacrylic acid ester, (b) 15 to 45% by weight of acrylonitrile and/or methacrylonitrile, and (c) 2 to 10% by weight of an unsaturated carboxylic acid.

3. The acrylic adhesive sheet of claim 1, wherein the epoxy resin (C) contains at least two epoxy groups and has an epoxy equivalent of 100 to 1,000.

4. The acrylic adhesive sheet of claim 1, wherein the curing accelerator (D) is an imidazole compound.

5. The acrylic adhesive sheet of claim 1, wherein the composition further comprises 10 to 40 parts by weight of an inorganic filler, per 100 parts by weight of the acrylic polymer (A).

6. An article of manufacture comprising a substrate having two surfaces wherein at least one surface has a coating of an acrylic adhesive composition comprising:
   (A) 100 parts by weight of an acrylic polymer containing carboxyl groups and having a glass transition temperature of 5 to 30° C.,
   (B) 1 to 20 parts by weight of a resol phenolic resin,
   (C) 1 to 20 parts by weight of an epoxy resin, and
   (D) 0.1 to 3 parts by weight of a curing accelerator.

7. The article of claim 6 wherein the substrate is a plastic film.

8. The article of claim 6 wherein the substrate is a plastic film wherein the plastic is selected from the group consisting of polyethylene, polypropylene, polytnethylpentene, and polyethylene terephthalate.

9. The article of claim 6 wherein the coating has a thickness of 10 to 100 μm.

10. The article of claim 6 further comprising a release paper sheet in contact with the coating.

* * * * *